(12) United States Patent
Jung et al.

(10) Patent No.: US 10,991,786 B2
(45) Date of Patent: Apr. 27, 2021

(54) SIGNAL CONTROL UNIT FOR AN ORGANIC LIGHT EMITTING DIODE DISPLAY DEVICE

(71) Applicant: DB HITEK CO., LTD., Seoul (KR)

(72) Inventors: Jin Hyo Jung, Suwon-si (KR); Jung Hyun Lee, Yeoju-si (KR); Dae Il Kim, Cheongju-si (KR); Bum Seok Kim, Seoul (KR); Seung Ha Lee, Hwaseong-si (KR); Sang Yong Lee, Chungju-si (KR); Dong Hoon Park, Uiwang-si (KR)

(73) Assignee: DB HITEK CO., LTD., Seoul (KR)

( * ) Notice: Subject to any disclaimer, the term of this patent is extended or adjusted under 35 U.S.C. 154(b) by 166 days.

(21) Appl. No.: 16/136,468

(22) Filed: Sep. 20, 2018

(65) Prior Publication Data

US 2019/0088732 A1 Mar. 21, 2019

(30) Foreign Application Priority Data

Sep. 20, 2017 (KR) .......................... 10-2017-0121386

(51) Int. Cl.
*H01L 29/08* (2006.01)
*H01L 27/32* (2006.01)
(Continued)

(52) U.S. Cl.
CPC ........ *H01L 27/3272* (2013.01); *H01L 27/124* (2013.01); *H01L 27/1214* (2013.01);
(Continued)

(58) Field of Classification Search
CPC ............. H01L 27/3272; H01L 27/1248; H01L 27/124; H01L 27/1214; H01L 51/5271;
(Continued)

(56) References Cited

U.S. PATENT DOCUMENTS

| 6,433,767 B1 * | 8/2002 | Murade ............... G02F 1/13454 345/92 |
| 2002/0030193 A1 * | 3/2002 | Yamazaki ........... H01L 51/5234 257/98 |

(Continued)

FOREIGN PATENT DOCUMENTS

KR 10-0791011 12/2007

*Primary Examiner* — Caleb E Henry
(74) *Attorney, Agent, or Firm* — Patterson Thuente Pedersen, P.A.

(57) ABSTRACT

A signal control unit for an organic light emitting diode (OLED) display device includes a substrate structure including a plurality of active elements for the pixels, first metal electrodes disposed on the substrate structure, and configured to be electrically connected to a portion of each of the active elements, second metal electrodes disposed over and adjacent the first metal electrodes, configured to electrically connected to corresponding ones of the first metal electrodes, respectively, by via contacts extending vertically to electrically connect the first metal electrodes to the second metal electrodes, and interlayer insulating layer structure interposed between the first electrodes and the second electrodes and having the via contacts therein, the interlayer insulating layer structure having a stacked structure in which a first interlayer insulating layer, a light blocking layer and a second interlayer insulating layer are stacked in order.

10 Claims, 6 Drawing Sheets

(51) Int. Cl.
*H01L 51/52* (2006.01)
*H01L 27/12* (2006.01)

(52) U.S. Cl.
CPC ...... *H01L 27/1248* (2013.01); *H01L 27/3258* (2013.01); *H01L 51/5271* (2013.01); *H01L 27/3297* (2013.01); *H01L 2227/323* (2013.01)

(58) Field of Classification Search
CPC ............. H01L 27/3258; H01L 27/3297; H01L 2227/323
See application file for complete search history.

(56) References Cited

U.S. PATENT DOCUMENTS

| | | | |
|---|---|---|---|
| 2005/0127810 A1* | 6/2005 | Fukuhara | G02F 1/136227 313/364 |
| 2006/0043360 A1* | 3/2006 | Kim | H01L 27/3246 257/40 |
| 2007/0257254 A1* | 11/2007 | Yang | H01L 27/3272 257/40 |
| 2007/0263156 A1* | 11/2007 | Ishii | H01L 29/12 349/143 |
| 2008/0143664 A1* | 6/2008 | Nakagawa | G02F 1/136286 345/92 |
| 2015/0123106 A1* | 5/2015 | Yasumoto | H01L 51/003 257/40 |
| 2016/0320654 A1* | 11/2016 | Kim | G02F 1/1333 |
| 2018/0060641 A1* | 3/2018 | Kim | G06K 9/0004 |
| 2020/0020757 A1* | 1/2020 | Li | H01L 27/3258 |

\* cited by examiner

SIGNAL CONTROL UNIT FOR AN ORGANIC LIGHT EMITTING DIODE DISPLAY DEVICE

CROSS-REFERENCE TO RELATED APPLICATION

This application claims priority to Korean Patent Application No. 10-2017-0121386, filed on Sep. 20, 2017 and all the benefits accruing therefrom under 35 U.S.C. § 119, the contents of which are incorporated by reference in their entirety.

TECHNICAL FIELD

The present disclosure relates to a signal control unit for an organic light emitting diode display device, a method of manufacturing the same, and an organic light emitting diode (OLED) display device including the same, and more particularly, to a signal control unit for an OLED display device capable of controlling signals for displaying images using a light emitting phenomenon of organic material, a method of manufacturing the signal control unit for an OLED display device and a light emitting diode display device including the signal control unit.

BACKGROUND

Currently, a flat display device such as a plasma display panel (PDP), a liquid crystal display (LCD) device, an organic light emitting diode (OLED) display device has been researched and developed.

The OLED display device is classified as one of a spontaneous light emitting device, which may make it possible to be downsized and lightened because the OLED display device may not require a backlight unit which has been normally implemented into the LCD device.

Further, the OLED display device can have a better viewing angle and contrast ratio than a similar liquid crystal display (LCD) device. Furthermore, the OLED display device may have advantages in terms of power consumption, and the OLED display device can be driven by a relatively low DC voltage and have a quick response speed. The OLED display device may be resistant to external impact and have a wide temperature range of acceptable driving temperatures. In particular, since the manufacturing process is simple for an OLED device, there is an advantage that the production cost can be saved compared to a conventional LCD device.

The OLED display device may include a signal control unit for controlling a signal for each pixel, a light emitting unit for generating light using an organic material in response to the signal, and a protection unit formed on the light emitting unit to protect the unit as a whole. At this time, the OLED display device may emit light generated in the light emitting unit outwardly through the protection unit provided at an upper portion thereof, thereby realizing an image.

However, the light generated in the light emitting unit may be unintentionally directed to the signal control unit provided at a lower portion of the OLED device. Particularly, light may affect the active element provided in the signal control unit. For example, when either an Electrically Erasable Programmable Read-Only Memory (EEPROM) or an Erasable Programmable Read-Only Memory (EPROM) is provided as an example of the active element and the light is irradiated to electric charges stored in a floating gate included in the EEPROM or EPROM, the electric charges may be activated and abnormally discharged from the floating gate. As a result, the light incident on the signal control unit may cause malfunction of the active element.

Meanwhile, the signal control unit may include a plurality of metal electrodes and an interlayer insulating layer for insulating the metal electrodes from each other. When the light-emitting unit including the organic light-emitting layer is provided on the signal control unit, the organic light-emitting layer may be divided into pixels by forming a plurality of trenches in the interlayer insulating layer. In an etching process for forming the trenches, the pixel isolation characteristics may be changed as the depths of the trenches are different from each other. As a result, a change in optical characteristics of the OLED display device may occur.

SUMMARY

Embodiments described herein provide a signal control unit for an OLED display device capable of preventing a malfunction from occurring due to incident light.

The example embodiments of the present invention further include a method of manufacturing a signal control unit for an OLED display device.

The example embodiments described herein further include an OLED display device including a signal control unit capable of preventing a malfunction from occurring due to incident light.

According to an example embodiment of the present invention, a signal control unit for an OLED display device includes a substrate structure including a plurality of active elements for each of a plurality of pixels, first metal electrodes disposed on the substrate structure and at least one of the first metal electrodes configured to be electrically connected to a portion of each one of the plurality of active elements, second metal electrodes disposed over the first metal electrodes such that each of the second metal electrodes is configured to be electrically connected to a corresponding one of the first metal electrodes, via contacts extending vertically to electrically connect the first metal electrodes to the corresponding ones of the second metal electrodes, and an interlayer insulating layer structure interposed between the first electrodes and the second electrodes and having the via contacts therein, the interlayer insulating layer structure defining a stacked structure in which a first interlayer insulating layer, a light blocking layer, and a second interlayer insulating layer are stacked sequentially.

In an example embodiment, the light blocking layer may include a material having a refractive index in a range of about 2.1 to about 2.2 with respect to a visible light.

In an example embodiment, the first and the second interlayer insulating layer may include silicon oxide, and the light blocking layer may include silicon nitride.

In an example embodiment, the light blocking layer may have a nitrogen concentration profile where a nitrogen concentration increases continuously in portions of the light blocking layer that are closer to the substrate structure.

In an example embodiment, the second metal electrodes may be disposed on the second interlayer insulating layer, and the signal control unit may further include a third interlayer insulating layer disposed between the second metal electrodes and on the second interlayer insulating layer.

The signal control unit may further include a trench portion disposed between the second metal electrodes and exposing an upper surface of the light blocking layer, the trench portion separating the pixels from each other, and a second interlayer insulating layer pattern and a third interlayer insulating layer pattern defined by the trench portion and formed from inner peripheries of an etched second interlayer insulating layer and an etched third interlayer insulating layer.

The signal control unit may further include an electric field concentration suppressing layer disposed along the profile of the trench portion to partially cover the third interlayer insulating layer pattern and the second metal electrodes.

According to an example embodiment of the present invention, a method of manufacturing a signal control unit for an OLED display device includes preparing a substrate structure including an active element for each of a plurality of pixels, forming first metal electrodes on the substrate structure, the first metal electrodes being adapted to be electrically connected to a portion of the active elements, forming an interlayer insulating layer structure on the substrate structure, the interlayer insulating layer structure having a stacked structure in which a first interlayer insulating film, a light blocking film, and a second interlayer insulating film are stacked sequentially to cover the first metal electrodes, forming via contacts vertically extending through the interlayer insulating layer structure and interconnecting the first metal electrodes, and forming second metal electrodes on the interlayer insulating layer structure to be electrically connected to the first metal electrodes through the via contacts.

In example embodiment, the light blocking layer may be formed using a material having a refractive index in a range of about 2.1 to about 2.2 with respect to a visible light.

In example embodiment, the first and the second interlayer insulating layer may include silicon oxide, and the light blocking layer may include silicon nitride.

In example embodiment, the light blocking layer may be formed to have a nitrogen concentration profile whereby a nitrogen concentration of the light blocking layer increases continuously with proximity to the substrate structure.

In example embodiment, the second metal electrodes may be disposed on the second interlayer insulating layer, and the method may further include forming a third interlayer insulating layer on the second interlayer insulating layer to cover the second metal electrodes.

In example embodiment, the method may further include patterning the second and the third interlayer insulating layers to form a trench portion disposed between the second metal electrodes, exposing an upper surface of the light blocking layer and separating the pixels from each other, a second interlayer insulating layer pattern, and a third interlayer insulating layer pattern.

In example embodiment, patterning the second and the third interlayer insulating layer may include performing an etching process using the light blocking layer as an etch stop layer.

In example embodiment, the method may further include forming an electric field concentration suppressing layer along the profile of the trench portion to partially cover the third interlayer insulating layer pattern and the second metal electrodes.

According to an example embodiment of the present invention, an OLED display device includes a signal control unit including a substrate structure including a plurality of active elements for a counterpart plurality of pixels, respectively, first metal electrodes disposed on the substrate structure, and being configured to be electrically connected to a portion of each of the active elements, second metal electrodes disposed over and adjacent the first metal electrodes and being configured to be electrically connected to the first metal electrodes, respectively, via contacts extending vertically to electrically connect the first metal electrodes to the second metal electrodes, and interlayer insulating layer structure interposed between the first electrodes and the second electrodes and having the via contacts therein, the interlayer insulating layer structure having a stacked structure in which a first interlayer insulating layer, a light blocking layer and a second interlayer insulating layer are stacked sequentially, an organic light emitting unit disposed over the signal control unit, the organic light emitting unit including a plurality of light emitting regions for each of pixels, and a passivation unit entirely covering the organic light emitting unit, the passivation unit including a color filter layer.

In an example embodiment, the second metal electrodes may be disposed on the second interlayer insulating layer, and the OLED display device may further include a third interlayer insulating layer disposed between the second metal electrodes and on the second interlayer insulating layer.

In an example embodiment, the OLED display device may further include a trench portion disposed between the second metal electrodes and exposing an upper surface of the light blocking layer, the trench portion separating the pixels from each other, and a second interlayer insulating layer pattern and a third interlayer insulating layer pattern defined by the trench portion and formed from an etched second interlayer insulating layer and an etched third interlayer insulating layer.

In an example embodiment, the OLED display device may further include an electric field concentration suppressing layer disposed along the profile of the trench portion to partially cover the third interlayer insulating layer pattern and the second metal electrodes.

According to example embodiments of the present invention, the interlayer insulating layer structure has a stacked structure where the first interlayer insulating layer, the light blocking layer, and the second interlayer insulating film are stacked sequentially. Here, the light blocking layer may be formed using silicon nitride. Since there is a refractive index difference between the light blocking layer and the second interlayer insulating layer, the total reflection of the incident light is generated at an interface between the light blocking layer and the second interlayer insulating layer. This may prevent the active elements included in the substrate structure from malfunctioning.

In addition, since there is a difference in an etch rate between the light blocking layer and the second interlayer insulating layer, the light blocking layer may be used as an etching stop layer in an etching process for forming the trench portion for pixel separation. That is, the light blocking layer may perform a light blocking function both to effectively cause total reflection of incident light and also serve as an etch stop layer. Therefore, as the depth of the trench portion is uniform, the optical characteristics of the signal control unit may be kept uniform.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Subject matter hereof may be more completely understood in consideration of the following detailed description of various embodiments in connection with the accompanying figures, in which.

Figure 1:
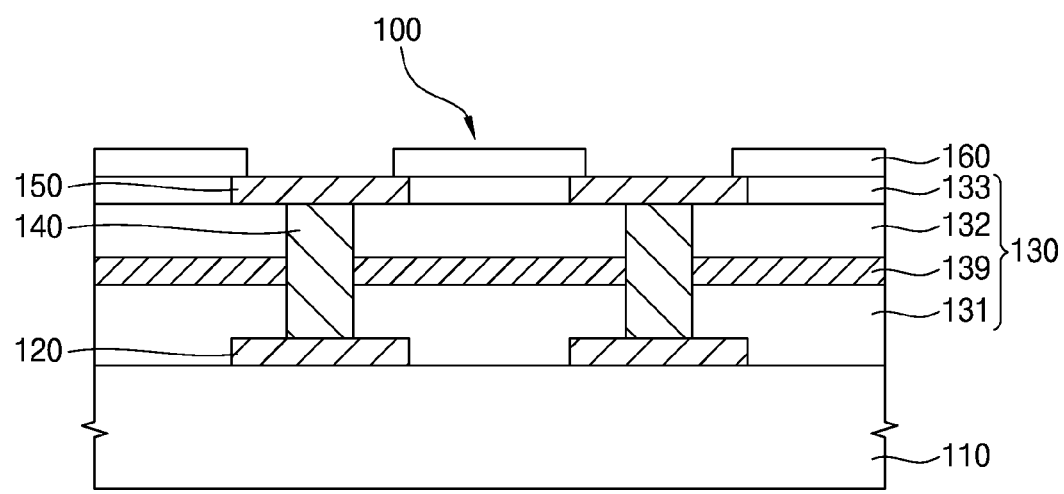
FIG. 1 is a cross sectional view illustrating a signal control unit for an OLED display device in accordance with an example embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

FIG. 1 is a cross sectional view illustrating a signal control unit for an OLED device in accordance with an example embodiment of the present invention.

Referring to FIG. 1, a signal control unit 100 for an OLED display device in accordance with an example embodiment of the present invention includes a substrate structure 110, first metal electrodes 120, second metal electrodes 150, via contacts 140 and interlayer insulating layer structure 130. The signal control unit 100 may control signals for driving each of a plurality of pixels included in an OLED display device. Further, the signal control unit 100 may control a path of light which is generated by a light emitting unit (not shown) positioned over the signal control unit 100.

The substrate structure 110 may control electric signals to be applied to each of the pixels of the light emitting unit. That is, the substrate structure 110 may includes a substrate (not shown) and active elements (not shown) corresponding to each of pixels.

The substrate, for example, can include a glass substrate or a polyimide substrate having a flexible characteristic.

The active elements include, for example, a diode or a transistor. Further, each of the active elements may include an erasable programmable read only memory (EPROM) capable of erasing data by irradiating ultraviolet light, and an electrically erasable programmable read only memory (EEPROM) capable of erasing data using electricity instead of ultraviolet light. Each of the active elements may control a signal using a floating gate where electrical charges are charged or erased so that the data can be removed.

The active elements may control the light emitting unit by applying an electrical signal to the light emitting unit via the first metal electrodes 120, the via contacts 140, and the second metal electrodes 150.

The first metal electrodes 120 are formed on the substrate structure 110. Each of the first metal electrodes 120 may be connected to one of the active elements. When the active elements are transistors, each of the first metal electrodes 120 may be connected to a source/drain terminal of the transistors.

The first metal electrodes 120 may be made of copper, aluminum, tungsten, or an alloy thereof, for example.

The second metal electrodes 150 are disposed at an upper portion of the signal control unit 100 and are spaced apart from the first metal electrodes 120. Each of the second metal electrodes 150 corresponds to a corresponding or counterpart one of the first metal electrodes 120. Each of the second metal electrodes 150 may be electrically connected to its counterpart one of the first metal electrodes 120. Each of the first metal electrodes 120 and the second metal electrodes 150 may be electrically connected to each other via a corresponding or counterpart one of the via contacts 140.

When the active elements include transistor, each of the first metal electrodes 120 is connected to a source/drain terminal of the transistor, so that each of the second metal electrodes 150 may function as an anode electrode.

The second metal electrodes 150 may be formed of the same metal material as the first metal electrodes 120. That is, the second metal electrodes 150 may be made of copper, aluminum, tungsten, or an alloy thereof, for example, as described above with respect to the first metal electrodes 120.

The via contacts 140 interconnect the first and second metal electrodes 120 and 150. Each of the via contacts 140 extends in a vertical direction with respect to the orientation of FIG. 1. Each of the via contacts 140 may extend from the upper surface of each of the first metal electrodes 120 to the lower surface of each of the second metal electrodes 150 to electrically connect the first and second metal electrodes 120 and 150 to each other.

The via contacts 140 may be made of copper, aluminum, tungsten, or an alloy thereof, for example.

The interlayer insulating layer structure 130 is interposed between the first metal electrodes 120 and the second metal electrodes 150. That is, the first metal electrodes 120, the interlayer insulating layer structure 130 and the second metal electrodes 150 may be stacked sequentially.

The via contacts 140 are provided in the interlayer insulating layer structure 130 and extend vertically with respect to the orientation of FIG. 1. Therefore, the first metal electrodes 120 and the second metal electrodes 150 may be electrically connected to each other by the via contacts 140.

The interlayer insulating layer structure 130 includes a first interlayer insulating layer 131, a light blocking layer 139, and a second interlayer insulating layer 132. The interlayer insulating layer structure 130 may have a stacked structure in which the first interlayer insulating layer 131, the light blocking layer 139, and the second interlayer insulating layer 132 are sequentially stacked.

The first interlayer insulating layer 131 is formed on the substrate structure 110 to cover the first metal electrodes 120. The first interlayer insulating layer 131 can be made of, for example, silicon oxide.

The light blocking layer 139 is formed on the first interlayer insulating layer 131. The light blocking 139 may block the light generated from the organic light emitting unit located over the signal control unit 100 to suppress the light from arriving at the active elements included in the substrate structure 110. Thus, a malfunction of the active elements due to the light may be suppressed.

When the first and second interlayer insulating layer 131 and 132 are made of silicon oxide, the light blocking layer 139 may be made of silicon nitride, for example. That is, the light generated from the organic light emitting unit can be effectively totally reflected due to the refractive index difference between the light blocking layer 139 and the first and second interlayer insulating layer 131 and 132. Thus, the light blocking layer 139 may prevent the light which passes between the second metal electrodes 150 and through the second interlayer insulating layer 132 from reaching to the active elements included in the substrate structure 110.

When the light blocking layer 139 is made of silicon nitride, a concentration of nitrogen atoms in the silicon nitride may be adjusted to control a refractive index of the light blocking layer 139.

That is, as the concentration of nitrogen atoms increases, the refractive index of the light blocking layer 139 increases, so that the refractive index difference between the second interlayer insulating layer 132 and the light blocking layer 139 may increase. Thus, the light can be totally reflected from the interface between the second interlayer insulating layer 132 and the light blocking layer 139.

The second interlayer insulating layer 132 is formed on the light blocking layer 139. The second interlayer insulating layer 132 may be formed of the same material as the first interlayer insulating layer 131. For example, the second interlayer insulating layer 132 can also be made of silicon oxide.

In an example embodiment of the present invention, the light blocking layer 139 may have a refractive index in a range from 2.1 to 2.2 in the visible light region. Accordingly, the light blocking layer 139 may effectively block light generated from the organic light emitting device.

In an example embodiment of the present invention, the light blocking layer 139 may have a nitrogen concentration profile where the nitrogen concentration increases with increasing proximity to the substrate structure 110.

Thus, the refractive index difference between the light blocking layer 139 and the second interlayer insulating layer 132 may be continuously changed with respect to the direction in which the light is incident toward the signal control unit. Also, since the defect density at a heterojunction interface between the light blocking layer 139 and the second interlayer insulating layer 132 is suppressed from increasing considerably, the light absorption in the light blocking layer 139 may be suppressed the total reflection efficiency may be improved.

In an example embodiment of the present invention, the interlayer insulating layer structure 130 may further include a third interlayer insulating layer 133. The third interlayer insulating layer 133 is formed on the second interlayer insulating layer 132 and between the second metal electrodes 150.

Further, an electric field concentration suppressing layer 160 may be additionally provided to partially cover the third interlayer insulating layer 133 and the second metal electrodes 150. As a result, the electric field concentration suppressing layer 160 may suppress the generation of leakage current which may occur due to the concentration of the electric field at the interface between the second metal electrodes 150 and the third interlayer insulating layer 133.

Figure 2:
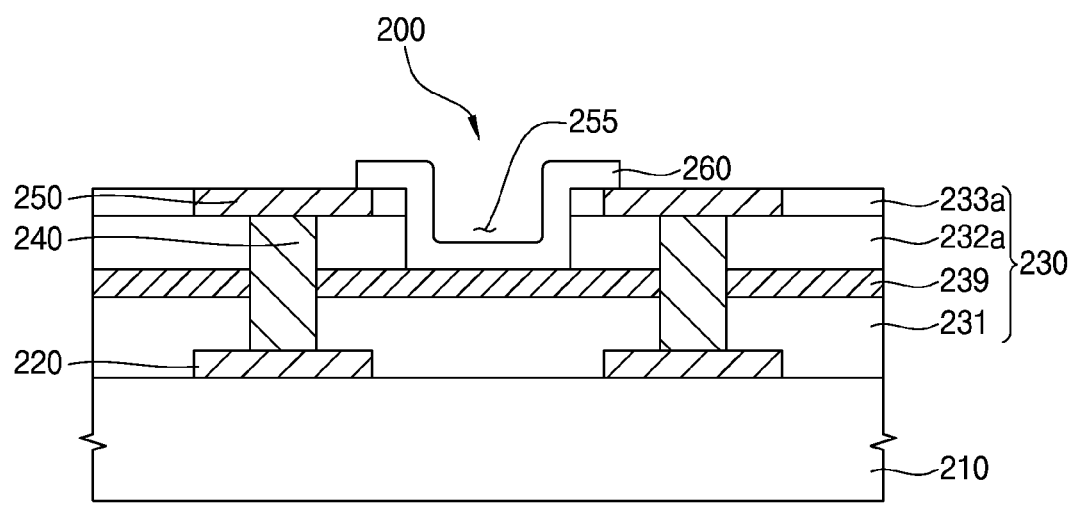
FIG. 2 is a cross sectional view illustrating a signal control unit for an OLED device in accordance with an example embodiment of the present invention.

FIG. 2 is a cross sectional view illustrating a signal control unit for an OLED device in accordance with an example embodiment of the present invention;

Referring to FIG. 2, a signal control unit 200 for an OLED display device according to an example embodiment of the present invention includes a substrate structure 210, first metal electrodes 220, second metal electrodes 250, via contacts 240, and an interlayer insulating layer structure 230. Since the substrate structure 210, the first metal electrodes 220, the second metal electrodes 250, and the via contacts 240 are substantially similar to their counterparts in FIG. 1, with reference numbers iterated by a factor of 100, a detailed description of those elements will be omitted.

The signal control unit 200 for the OLED device according to an embodiment of the present invention further defines a trench 255. The signal control unit 200 includes a second interlayer insulating layer pattern 232a and a third interlayer insulating layer pattern 233a which are formed by patterning structures similar to the second and third interlayer insulating layers 132 and 133 of FIG. 1, respectively.

The trench portion 255 is provided to expose an upper surface of the light blocking layer 239 between the second metal electrodes 250. The trench portion 255 is provided to separate each of the pixels from each other. That is, the trench portion 255 may separate by each pixel an organic material of the organic light emitting unit which is to be formed on the trench portion 255.

The outer circumference of the trench portion 255 is defined by the second interlayer insulating layer pattern 232a and the third interlayer insulating layer pattern 233a. That is, sidewalls of the second interlayer insulating layer pattern 232a and the third interlayer insulating layer pattern 233a enclose the trench portion 255.

For example, the second and third interlayer insulating layers (e.g., 132 and 133) are respectively patterned and converted into the second interlayer insulating layer pattern 232a and the third interlayer insulating layer pattern 233a.

The sidewalls of the second interlayer insulating layer pattern 232a and the third interlayer insulating layer pattern 233a define the trench portion 255.

In addition, the light blocking layer 239 may serve as an etching stopping layer when performing an etching process for patterning the second and third interlayer insulating layers 132 and 133. Thus, the trench portion 255 may have a uniform depth, thereby making optical characteristics of the signal control unit 200 uniform.

In an example embodiment of the present invention, the signal control unit 200 may further include an electric field concentration suppressing layer 260. The electric field concentration suppressing layer 260 is formed along the profile of the trench portion 255. The electric field concentration suppressing layer 260 is continuously formed to partially cover the third interlayer insulating layer pattern 233a and the second metal electrodes 250. Thus, the electric field concentration suppressing layer 260 may suppress a leakage current from occurring due to the concentration of the electric field at the interface between the second metal electrodes 250 and the third interlayer insulating layer pattern 233a.

FIGS. 3 to 7 are cross sectional views illustrating a method of manufacturing a signal control unit of an OLED display device in accordance with an example embodiment of the present invention.

Figure 3:
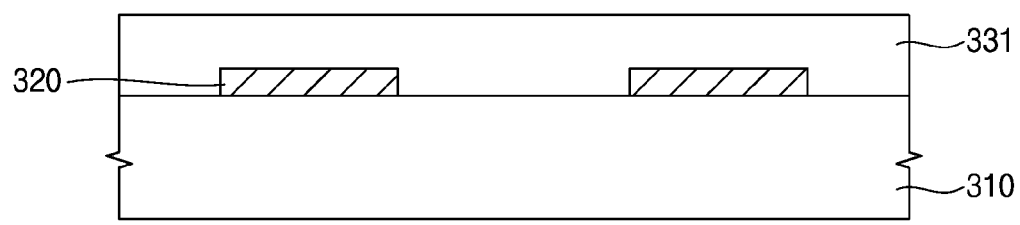
FIGS. 3 to 7 are cross sectional views illustrating a method of manufacturing a signal control unit of an OLED display device in accordance with an example embodiment of the present invention.

Referring to FIG. 3, according to an example embodiment of a method of manufacturing a signal control unit for an organic light emitting diode (OLED) display device, a substrate structure 310 including active elements for each pixel is prepared.

The substrate structure 310 may be prepared by forming active elements (not shown) formed on the substrate for each pixel.

The active elements are formed to include, for example, a diode or a transistor. Further, the active elements may include an EPROM capable of erasing data by irradiating with ultraviolet light, and an EEPROM capable of erasing data using electricity instead of ultraviolet light. The active elements may control a signal using a floating gate. Electric charges are charged or erased in the floating gate, so that data may be removed.

Subsequently, first metal electrodes 320 are formed on the substrate structure 310 to be indirectly electrically connected to the active elements.

In order to form the first metal electrodes 320, a first metal layer (not shown) is first formed on the substrate structure 310. The first metal layer may be formed through a sputtering process or a chemical vapor deposition process. Then, the first metal layer is patterned to convert the first metal layer into the first metal electrodes 320. In order to pattern the first metal layer, an etching process may be performed.

Figure 4:
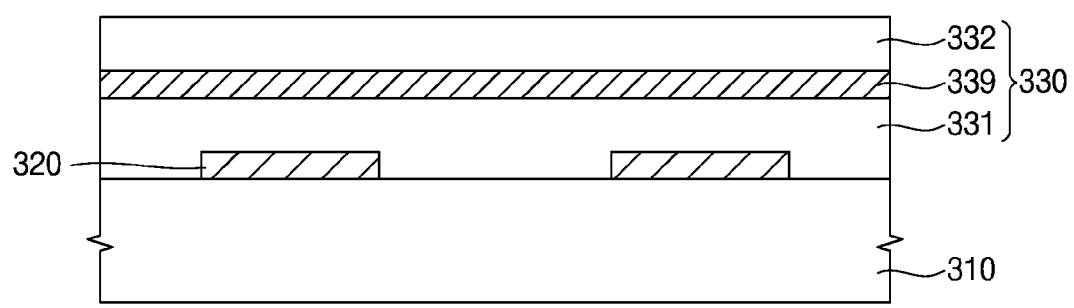

Referring to FIG. 4, an interlayer insulating layer structure 330 is formed on the substrate structure 310 to cover the first metal electrodes 320. The interlayer insulating layer structure 330 may be formed by sequentially forming a first interlayer insulating layer 331, a light blocking layer 339 and a second interlayer insulating layer 332 on the substrate structure 310.

The first interlayer insulating layer 331 is formed on the substrate structure 310 to cover the first metal electrodes 320. The first interlayer insulating layer 331 may be formed through a plasma enhanced chemical vapor deposition process. The first interlayer insulating layer 331 may be formed using silicon oxide, in one embodiment.

The light blocking layer 339 is formed on the first interlayer insulating layer 331. The light blocking layer 339 may be formed using silicon nitride, in the embodiment where the first interlayer insulating layer 331 is formed of silicon oxide.

The second interlayer insulating layer 332 is formed on the light blocking layer 339. The second interlayer insulating layer 332 may be formed through a plasma enhanced chemical vapor deposition process. The second interlayer insulating layer 332 may be formed using the same material as the first interlayer insulating layer 331, such as silicon oxide.

Therefore, a refractive index difference between the light blocking layer 339 and the second interlayer insulating layer 332 exists. A total reflection of the incident light may effectively occur at an interface between the light blocking layer 339 and the second interlayer insulating layer 332.

Further, a difference in an etch rate between the light blocking layer 339 and the second interlayer insulating layer 332 may exist. Thus, the light blocking layer 339 may serve as an etch stop layer, while performing an etching process for forming the trench portion 355 (see FIG. 7) subsequently.

Figure 5:
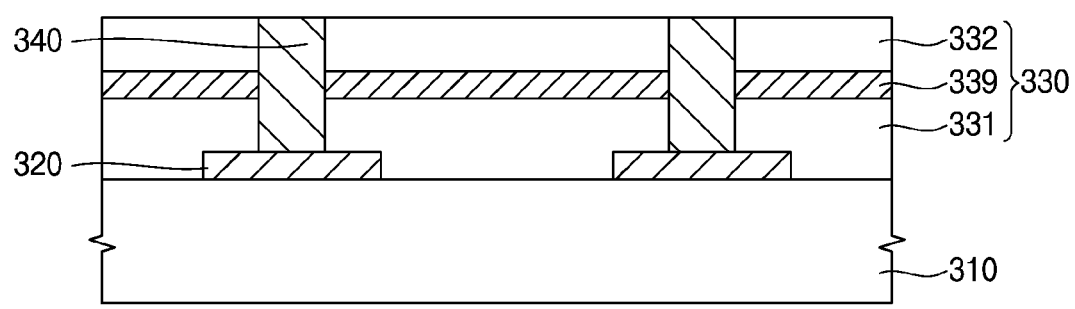

Then, via contacts 340 are formed to penetrate the interlayer insulating layer structure 330, as shown in FIG. 5. Therefore, the via contacts 340 extend in a vertical direction to be connected with the first metal electrodes 320. The first interlayer insulating layer 331, the light blocking layer 339 and the second interlayer insulating layer 332 are partially etched to form via holes to expose an upper surface of each of the first metal electrodes 320. Then, the via holes are filled with a metal material to form via contacts 340.

Figure 6:
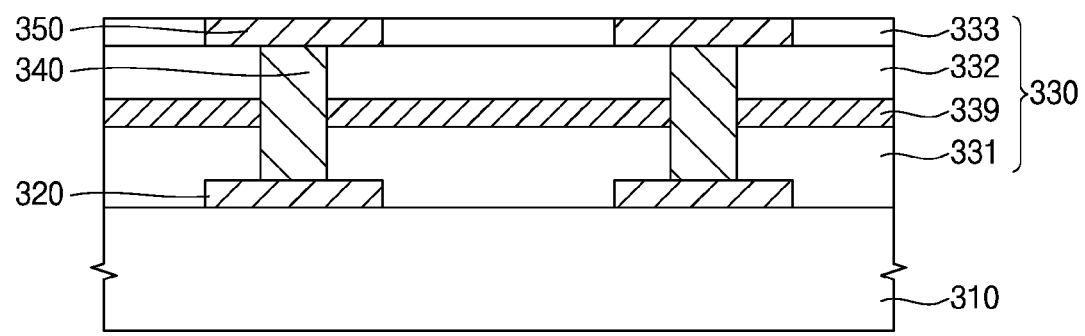

Next, second metal electrodes 350 are formed on the interlayer insulating layer structure 330 to electrically connect the first metal electrodes 320 through the via contacts 340, as shown in FIG. 6.

In order to form the second metal electrodes 350, a second metal layer (not shown) is formed on the interlayer insulating layer structure 330. The second metal layer may be formed through a sputtering process or a chemical vapor deposition process. Then, the second metal layer is patterned to convert the second metal layer into the second metal electrode 350. In order to pattern the second metal layer, an etching process may be performed. Here, the second metal electrodes 350 may be formed on the second interlayer insulating layer 332.

In an example embodiment of the present invention, a third interlayer insulating layer 333 may be additionally formed on the second interlayer insulating layer 332 to partially cover the second metal electrodes 350, as shown in FIG. 6. The third interlayer insulating layer 333 may be formed using the same process and the same material as the first and second interlayer insulating layers 331 and 332 are.

Figure 7:
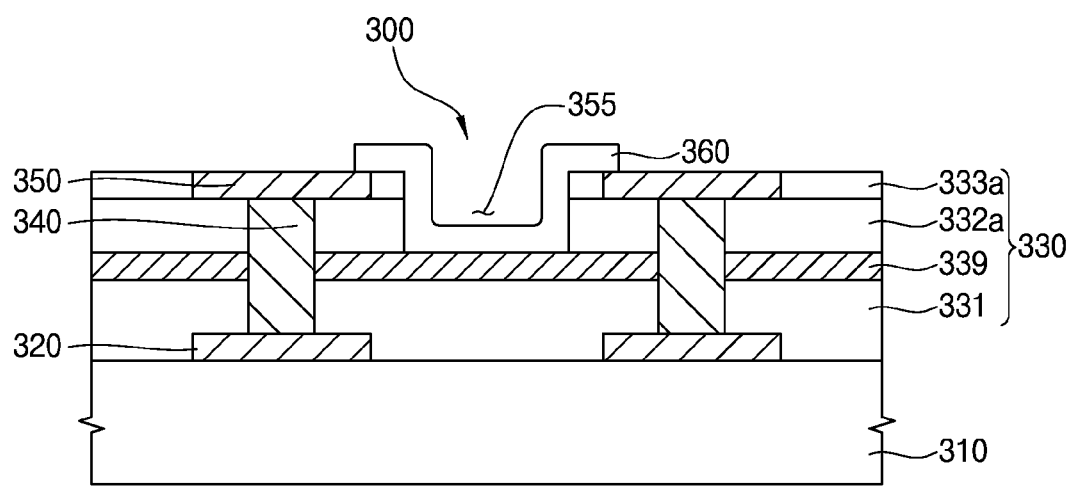

Next, the second and third interlayer insulating layers 332 and 333 are patterned to form a trench portion 355 exposing an upper surface of the light blocking layer 339 positioned between the second metal electrodes 350 and isolating each of the pixels from others, a second interlayer insulating layer pattern 332a and a third interlayer insulating layer pattern 333a, as shown in FIG. 7.

Here, an etching process may be performed to pattern the second and third interlayer insulating layers 332 and 333, respectively. The light blocking layer 339 may function as an etch stopping layer. Thus, when multiple trench portions 355 are formed in a single article or device, that plurality of trench portions will have a uniform depth, thereby making optical characteristics of the signal control unit 300 that are related to the properties of the trenches 355 uniform.

In an example embodiment of the present invention, an electric field concentration suppressing layer 360 may be additionally formed. The electric field concentration suppressing layer 360 is formed along the profile of the trench portion 355. The electric field concentration suppressing layer 360 is continuously formed to partially cover the third interlayer insulating layer pattern 333*a* and the second metal electrodes 350. Thus, the electric field concentration suppressing layer 360 may suppress leakage current from occurring due to the concentration of the electric field at interfaces between the second metal electrodes 350 and the third interlayer insulating layer pattern 333*a*.

Figure 8:
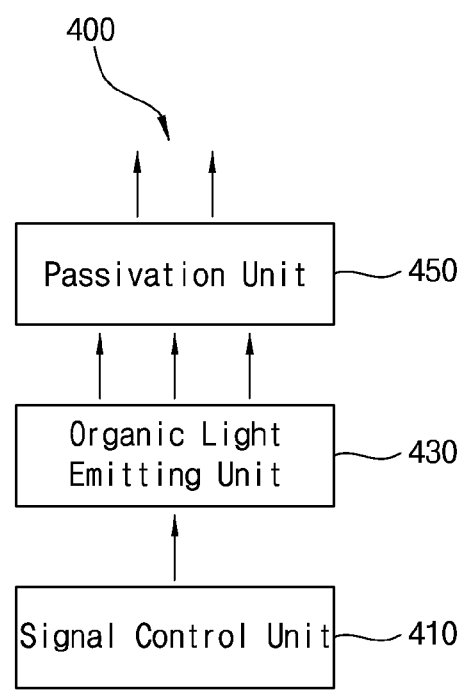
FIG. 8 is a block diagram illustrating an OLED display device in accordance with an example embodiment of the present invention.
Figure 9:
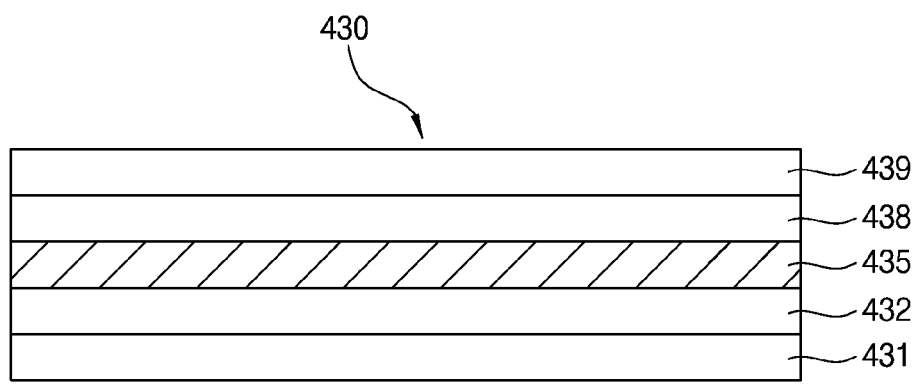
FIG. 9 is a cross sectional view illustrating the OLED display device shown in FIG. 8.

FIG. 8 is a block diagram illustrating an OLED display device in accordance with an example embodiment of the present invention. FIG. 9 is a cross sectional view illustrating the OLED device shown in FIG. 8.

FIGS. 2, 8 and 9, an organic light emitting diode display (OLED) device 400 according to an example embodiment of the present invention includes a signal control unit 410, an organic light emitting unit 430, and a passivation unit 450.

Since the signal control unit 410 has been described above with reference to FIG. 2, a detailed description thereof the signal control unit 410 will be omitted.

The organic light emitting unit 430 is provided on the signal control unit 410. The organic light emitting unit 430 is driven by a signal generated from the signal control unit 410.

The organic light emitting unit 430 includes an anode electrode 431, a hole transport layer 432, a light emitting layer 435, an electron transport layer 438 and a cathode electrode 439.

Holes injected into the anode electrode 431 move to an emission layer 435 through a hole transfer layer 432. Electrons injected from the cathode 439 are transferred to the light emitting layer 435 through an electron transfer layer 438. The holes/electrons collected to the light emitting layer 435 are recombined to emit light.

One portion of the light emitted as described above is emitted to the outside through a color filter layer included in the passivation unit 450, thereby realizing an image. Meanwhile, another portion of the light is directed to the substrate structure 410 and is irradiated downward. Some of the light is reflected from the second metal electrodes, and when the light passes between the second metal electrodes, the light can be totally reflected by the light blocking layer included in the interlayer insulating layer structure. This prevents the light from reaching to the active elements included in the substrate structure. Further, as the total reflection light is emitted to the outside through the organic light emitting unit, the organic light emitting diode display (OLED) device may have increased brightness.

Although the signal control unit and the OLED device have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A signal control unit for an organic light emitting diode (OLED) display device comprising:
   a substrate structure including a plurality of active elements corresponding to each of a plurality of pixels;
   first metal electrodes disposed on the substrate structure and at least one of the first metal electrodes configured to be electrically connected to a portion of each one of the plurality of active elements;
   second metal electrodes disposed over the first metal electrodes such that each of the second metal electrodes is configured to be electrically connected to a corresponding one of the first metal electrodes;
   via contacts extending vertically to electrically connect the first metal electrodes to the corresponding ones of the second metal electrodes; and
   an interlayer insulating layer structure interposed between the first electrodes and the second electrodes and having the via contacts therein, the interlayer insulating layer structure defining a stacked structure in which a first interlayer insulating layer, a light blocking layer and a second interlayer insulating layer are stacked sequentially,
   wherein the second metal electrodes are disposed on the second interlayer insulating layer, and the signal control unit further comprises a third interlayer insulating layer disposed between the second metal electrodes and arranged on the second interlayer insulating layer.

2. The signal control unit of claim 1, wherein the light blocking layer includes a material having a refractive index in a range of about 2.1 to about 2.2 with respect to a visible light.

3. The signal control unit of claim 1, wherein the first and the second interlayer insulating layers both comprise silicon oxide, and wherein the light blocking layer comprises silicon nitride.

4. The signal control unit of claim 1, wherein the light blocking layer has a nitrogen concentration profile that increases with increasing proximity to the substrate structure.

5. The signal control unit of claim 4, further comprising:
a trench portion disposed between the second metal electrodes and exposing an upper surface of the light blocking layer, the trench portion optically separating at least two of the pixels from each other; and
a second interlayer insulating layer pattern and a third interlayer insulating layer pattern defining an outer periphery of the trench portion therein.

6. The signal control unit of claim 5, further comprising an electric field concentration suppressing layer disposed along the outer periphery of the trench portion to partially cover the third interlayer insulating layer pattern and the second metal electrodes.

7. An organic light emitting diode (OLED) display device, comprising:
a signal control unit including a substrate structure including a plurality of active elements for a plurality of pixels,
first metal electrodes disposed on the substrate structure, the first metal electrodes configured to be electrically connected to a portion of at least one of the active elements,
second metal electrodes disposed over and adjacent the first metal electrodes, the second metal electrodes electrically connected corresponding ones of the first metal electrodes by via contacts extending vertically to electrically connect the first metal electrodes to the second metal electrodes, and
an interlayer insulating layer structure interposed between the first electrodes and the second electrodes and having the via contacts therein, the interlayer insulating layer structure having a stacked structure in which a first interlayer insulating layer, a light blocking layer and a second interlayer insulating layer are stacked sequentially,
an organic light emitting unit disposed over the signal control unit, the organic light emitting unit including a plurality of light emitting regions corresponding to each of the plurality of pixels; and
a passivation unit entirely covering the organic light emitting unit, the passivation unit including a color filter layer.

8. The OLED display device of claim 7, wherein the second metal electrodes are disposed on the second interlayer insulating layer, and
the OLED display device further comprising a third interlayer insulating layer disposed between the second metal electrodes and on the second interlayer insulating layer.

9. The OLED display device of claim 8, further comprising:
a trench portion defined by the second metal electrodes and exposing an upper surface of the light blocking layer, the trench portion separating the pixels from each other; and
a second interlayer insulating layer pattern and a third interlayer insulating layer pattern defining and outer periphery of the trench portion therein.

10. The OLED display device of claim 9, further comprising an electric field concentration suppressing layer disposed along the periphery of the trench portion to partially cover the third interlayer insulating layer pattern and the second metal electrodes.

* * * * *